(12) United States Patent
Apel

(10) Patent No.: US 7,102,464 B1
(45) Date of Patent: Sep. 5, 2006

(54) SWITCHED TRANSFORMER FOR ADJUSTING POWER AMPLIFIER LOADING

(75) Inventor: Thomas R. Apel, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 14 days.

(21) Appl. No.: 10/117,541

(22) Filed: Apr. 4, 2002

(51) Int. Cl.
*H03H 7/00* (2006.01)

(52) U.S. Cl. .................................. 333/172; 333/177

(58) Field of Classification Search ............... 333/17.3, 333/24 R, 25, 26, 32, 33, 172, 177–180
See application file for complete search history.

(56) References Cited

U.S. PATENT DOCUMENTS

| | | | |
|---|---|---|---|
| 5,060,294 A | | 10/1991 | Schwent et al. ............... 455/93 |
| 5,285,179 A | * | 2/1994 | Wignot et al. ................. 334/15 |
| 5,321,348 A | * | 6/1994 | Vinciarelli et al. ......... 323/222 |
| 5,432,431 A | * | 7/1995 | Vinciarelli et al. ......... 323/222 |
| 5,619,283 A | * | 4/1997 | Pugel .......................... 348/731 |
| 5,815,386 A | * | 9/1998 | Gordon ....................... 363/50 |

FOREIGN PATENT DOCUMENTS

| | | |
|---|---|---|
| EP | 0840349 A2 | 5/1998 |
| FR | 2452207 | 10/1980 |

OTHER PUBLICATIONS

"Broadband Transmission Line Transformer Family Matches A Wide Range Of Impedances", RF Design, Cardiff Publishing Co., vol. 17, No. 2, Feb. 1, 1994, pp. 62, 64-66.
"Some Borad-Band Transformers" by C.L. Ruthroff, Feb. 5, 1959 (revised Apr. 1, 1959), pp. 1337-1342.

\* cited by examiner

*Primary Examiner*—Kenneth B. Wells
(74) *Attorney, Agent, or Firm*—Bever Hoffman & Harms

(57) ABSTRACT

A circuit includes a transmission line transformer coupled between an input and output port. An inductor may be selectively coupled into the ground return path of the transmission line transformer to alter the impedance transformation provided between the input and output ports.

12 Claims, 3 Drawing Sheets

SWITCHED TRANSFORMER FOR ADJUSTING POWER AMPLIFIER LOADING

FIELD OF THE INVENTION

This invention relates to efficient power distribution and more particularly, to impedance matching using a transmission-line transformer.

BACKGROUND

Power amplifiers play an important role in both radio transmission and reception. For example, to produce an intelligible signal from radio transmissions received at an antenna, radio receivers must provide a significant amount of amplification. Similarly, radio transmitters will amplify their RF signals prior to transmission. In mobile applications such as wireless handsets, the power amplifier places the primary demand on battery charge. Thus, the efficiency of the power amplifier directly correlates with longer battery operation.

For efficient operation, a power amplifier's impedance should match the impedance of its antenna. If the impedance is not matched, a reflected wave will exist on the transmission line coupling the power amplifier and the antenna, lowering power efficiency. In addition, the impedance mismatch leads to frequency modulation distortion and a reactive component to the transmission line that may "frequency-pull" the power amplifier from its nominal frequency operating value. Accordingly, matching networks are used to couple between the power amplifier and antenna to provide impedance matching. However, depending upon the power output, a power amplifier's output impedance may change, making the design of such matching networks problematic. Moreover, a number of different types of matching circuits may be used such as inductor-capacitor (LC) networks, transformers, or transmission-line transformers. For example, U.S. Pat. No. 5,060,294 discloses a dual mode power amplifier that couples to its antenna through an LC network. Depending upon the mode of the power amplifier, the characteristics of the LC network change. Although the impedance of this matching LC network will change depending upon the mode, such networks are expensive and difficult to manufacture, especially at higher frequencies.

Moreover, at the higher frequencies such as used in the PCS band, an LC matching network may prove to be lossy compared to the use of a transmission line transformer. FIG. 1 illustrates a 4:1 Ruthroff transmission line transformer 5. Input port 7 is the low impedance side and output port 9 is the high impedance side. Thus, if a power amplifier having an output impedance of 12.5 Ω couples to input port 7 and a 50 Ω load couples to output port 9, the 4:1 impedance transformation provided by transmission line transformer 5 will match the source to the load. Unlike a conventional transformer, energy is not transmitted through transmission line transformer 5 solely by magnetic flux coupling. Instead, as the name implies, transmission line transformer 5 transmits energy through a transmission line mode. See, e.g, Jerry Sevick, *Transmission Line Transformers,* Noble Publishing Corp., 1996. The result is a broad-band impedance matching at low loss. However, this impedance matching will be constant and will not change in response to changes in power level or modulation mode.

Accordingly, there is a need in the art for improved matching networks that will adapt to various load or power conditions.

SUMMARY

In accordance with one aspect of the invention, a switched transformer circuit includes a transmission line transformer coupled between an input port and an output port. The circuit is configured to selectively couple an inductor into the ground return path of the transmission line transformer. In this fashion, when the inductor is coupled into the ground path, the impedance transformation provided by the transmission line transformer changes.

In accordance with another aspect of the invention, a method of adjusting loading between an input and an output includes an act of coupling a transmission line transformer between the input and the output to provide a first impedance transformation between the input and output. To adjust the loading, the method includes another act of coupling an inductor into the ground return path of the transmission line transformer to provide a second impedance transformation between the input and output.

DETAILED DESCRIPTION

Figure 1:
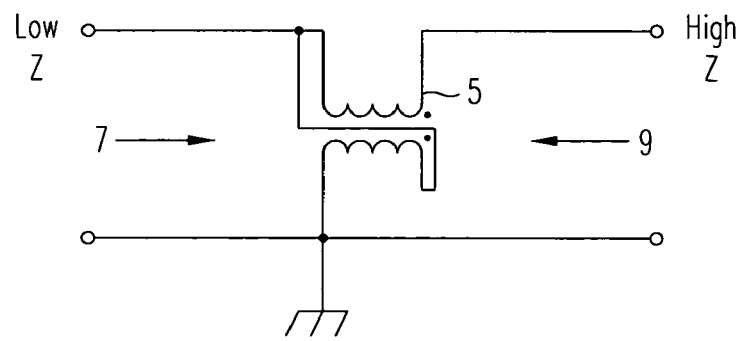
FIG. 1 is a diagram of a prior art transmission line transformer.
Figure 2:
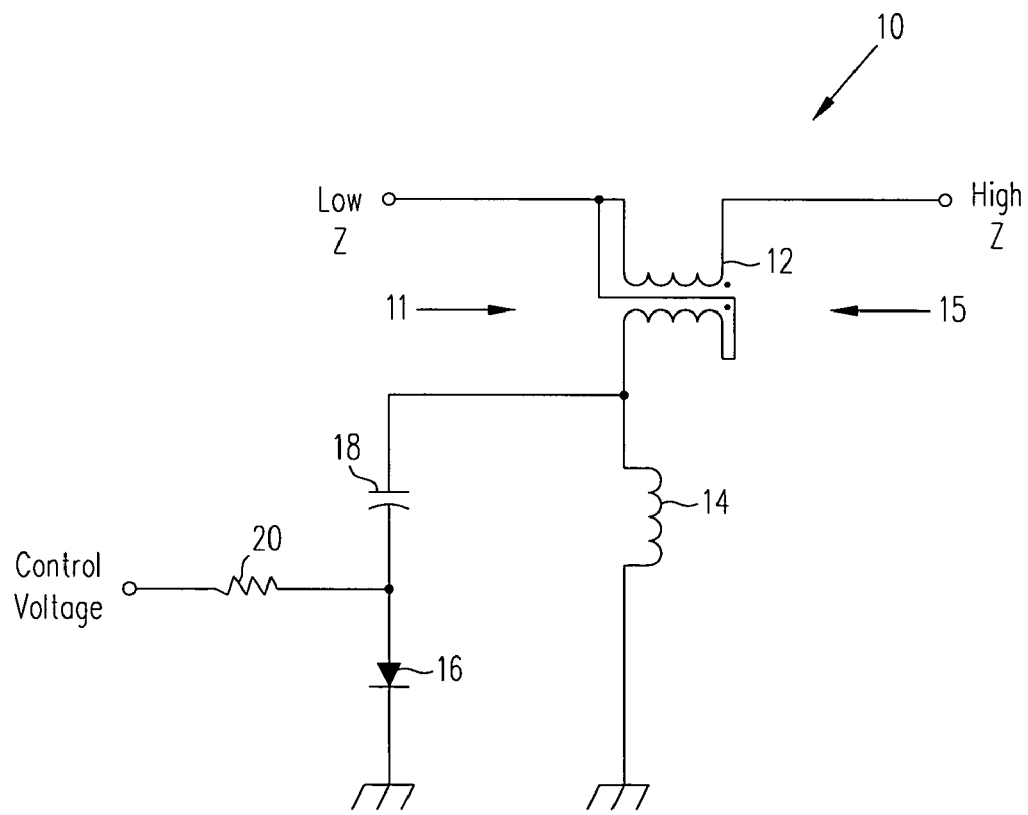
FIG. 2 is a diagram of a 4:1 switched transformer circuit according to one embodiment of the invention.

FIG. 2 illustrates a circuit 10 including a 4:1 transmission line transformer 12 that may alter its impedance transformation between an input port 11 and an output port 15. An inductor 14 in the ground return path of transmission line transformer 12 couples in parallel with a series combination formed by a diode 16 and a DC blocking capacitor 18. Diode 16 may be biased with a control voltage coupled through resistor 20. In this fashion, should diode 16 be forward biased so as to be conducting, very little ground return current from transmission line transformer 12 will flow through inductor 14, effectively removing it from circuit 10. With diode 16 being forward biased, it will appear as a short or very low resistance to an RF signal applied to input port 11 from a power amplifier (not illustrated), DC blocking capacitor 18 will also present a low impedance to an RF signal. As a result, when diode 16 is forward biased, transmission line transformer 12 will operate as discussed with respect to FIG. 1, providing a 4:1 impedance transformation between input port 11 and output port 15.

Figure 3:
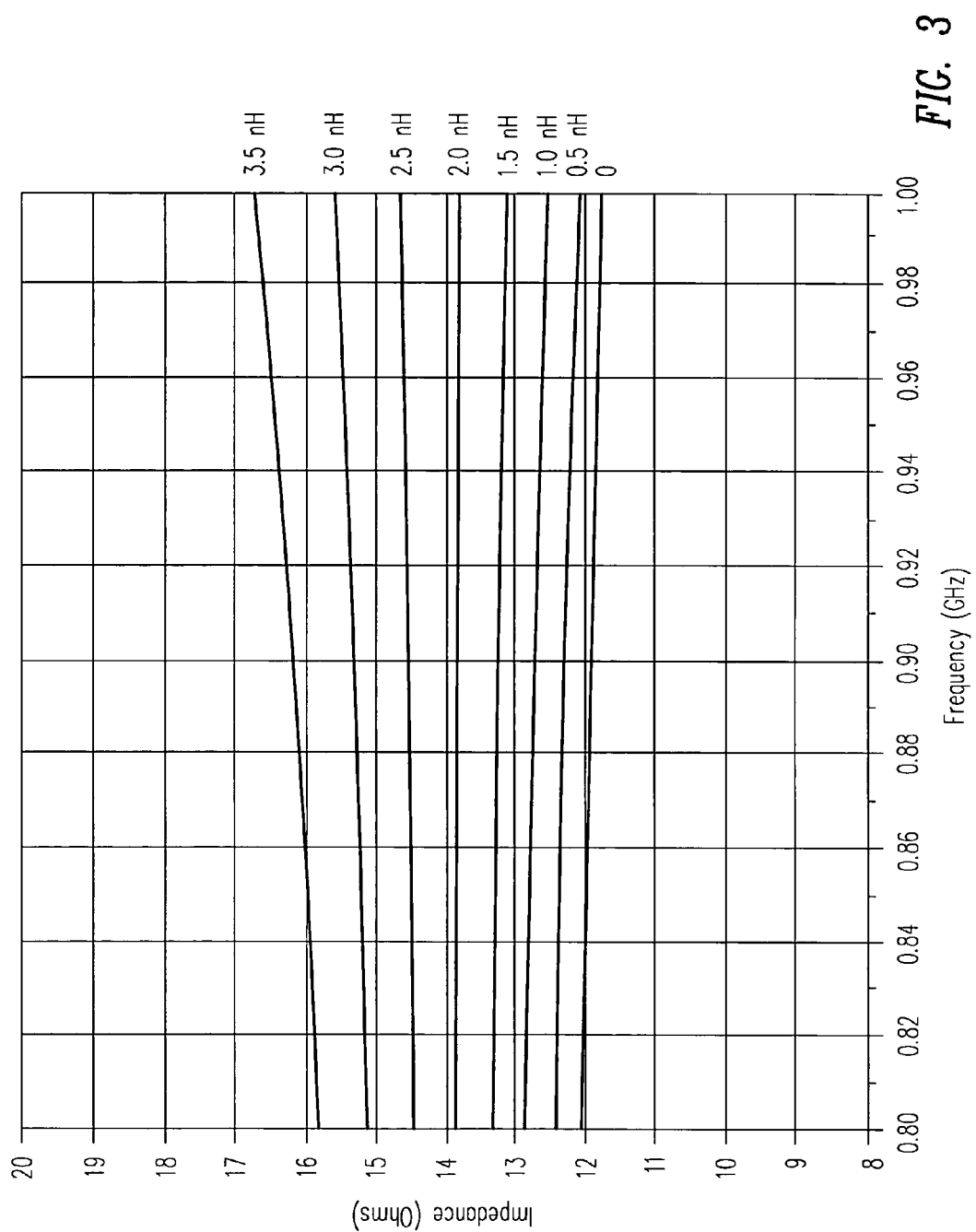
FIG. 3 is a graph illustrating the input impedance as a function of frequency for the 4:1 switched transformer circuit of FIG. 2 at various inductance values.

If, however, the control voltage does not forward bias diode 16, it will be non-conducting. It will be appreciated, however, depending upon the diode type used (PIN, etc.), that some reverse bias voltage may be necessary to ensure that diode 16 is non-conducting. The majority of the ground return current from transmission line transformer 12 will then flow through inductor 14. This current flow will lower the impedance transformation between input port 11 and output port 15. As the inductance from inductor 14 is increased, this impedance transformation decreases. For example, in one cellular band implementation, if inductor 14 equals 3.5 nH, the impedance transformation will drop to approximately 3:1. For such an impedance transformation, the impedance at input port 11 will be approximately 16 Ω when matched to a 50 Ω load. This impedance has a slight frequency dependence as seen in FIG. 3 over the frequency range of 0.8 to 1.0 GHz. In addition, FIG. 3 also illustrates the resulting impedances for this frequency range as the impedance of inductor 14 is stepped in 0.5 nH increments from 0.0 nH to 3.5 nH.

Referring back to FIG. 2, the control voltage thus determines which impedance transformation is provided by circuit 10. The control voltage may be generated according to a desired power level or mode of a power amplifier (not illustrated) producing the signal applied to input port 11. For example, the power amplifier may be operated at either a relatively high power level or a low power level. At the low power level, the output impedance of the power amplifier is increased with respect to the output impedance at the high power level. Should the desired power level or mode be above this low power level, the control voltage is brought high such that it forward biases diode 16, thereby producing a 4:1 impedance transformation. Conversely, if the desired power level is below this low power level, the control voltage is brought low such that diode 16 is non-conducting, thereby producing an impedance transformation less than 4:1. Alternatively or in conjunction, the control voltage may be generated according to the modulation mode of the power amplifier. For example, a dual mode cellular phone operating in a CDMA mode typically needs RF power levels of +28 dBm or less. When this cellular phone operates in an AMPS mode, it produces power levels of greater than +31 dBm. A loadline switch for a transmission line transformer such as that discussed with respect to FIG. 2 for such a dual mode cellular phone may provide greatly increased power efficiency.

Figure 4:
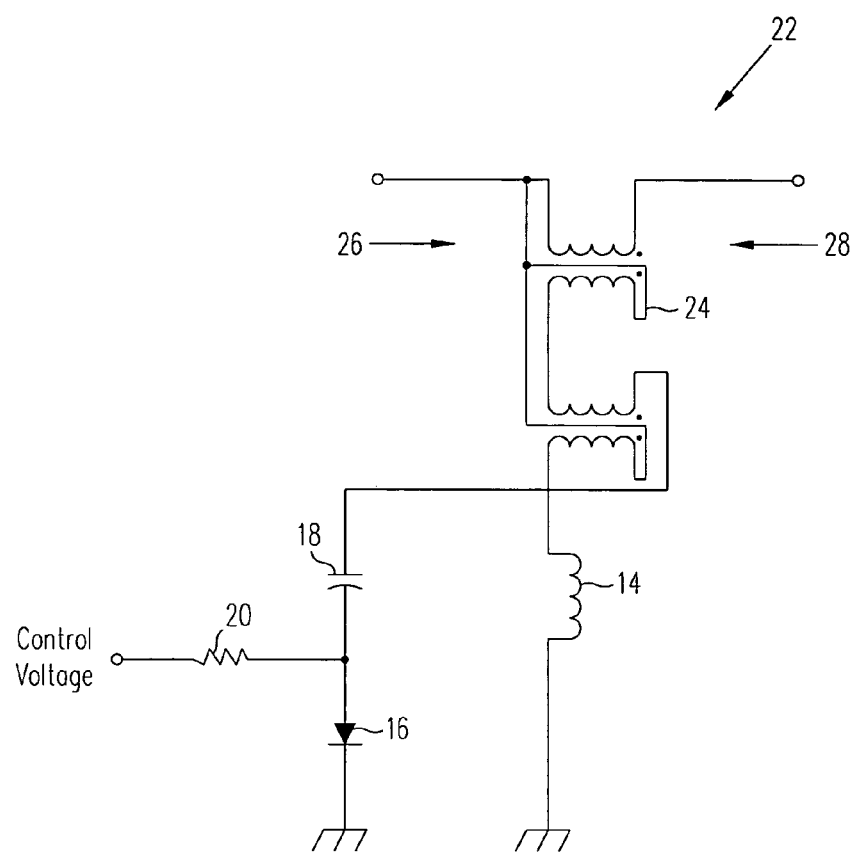
FIG. 4 is a diagram of a 9:1 switched transformer circuit according to one embodiment of the invention.

It will be appreciated that any type of transmission line transformer may be implemented in the present invention. For example, turning now to FIG. 4, a circuit 22 including a 9:1 impedance line transformer 24 is illustrated. Here, inductor 14, diode 16, and DC blocking capacitor 18 are arranged in the ground return path as discussed with respect to FIG. 2. Accordingly, when the control voltage is high so as to forward bias diode 16, a 9:1 impedance transformation exists between input and output ports 26 and 28, respectively. If the control voltage 20 is low such that diode 16 is non-conducting, a decreased impedance transformation exists between these ports. As discussed with respect to FIG. 2, the control voltage may be stepped according to the output power level of the power amplifier or the modulation mode being implemented.

Figure 5:
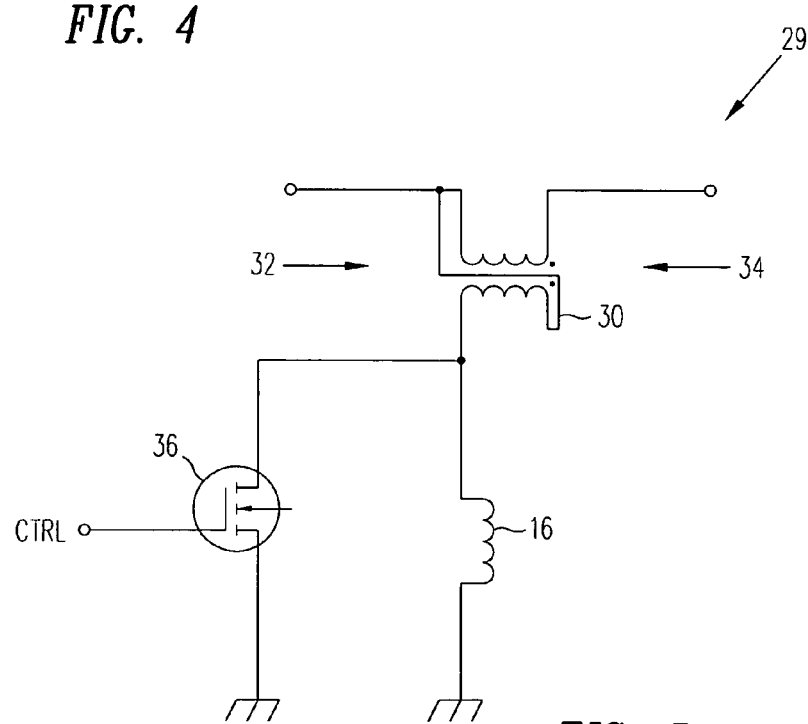
FIG. 5 is a diagram of a 4:1 switched transformer circuit according to one embodiment of the invention.

Other approaches of selectively coupling an inductor into the ground return path of a transmission line transformer may be implemented to practice the present invention. For example, FIG. 5 illustrates a circuit 29 including a 4:1 transmission line transformer 30 whose ground return path selectively includes an inductor 16 according to the operation of an n-mos FET 36. A control voltage CTRL couples to the gate of n-mos FET 36. Thus, if control voltage CTRL is low, n-mos FET 36 will be switched OFF. Inductor 16 is then coupled into the ground return path, thereby lowering the impedance transformation provided between input port 32 and output port 34. Conversely, if control voltage CTRL is high, n-mos FET 36 will be switched ON. Inductor 16 is then effectively removed from the ground return path such that the impedance transformation between input port 32 and output port 34 is 9:1. As discussed with respect to FIGS. 2 and 4, the level of the control voltage CTRL may be determined according to the power amplifier's power level or its modulation mode.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

I claim:

1. A circuit, comprising:
a transmission line transformer coupled between an input port and an output port and configured to transmit energy from the input port to the output port by a transmission line mode, the transmission line transformer also being coupled to a ground return path, wherein the transmission line transformer provides an impedance transformation between the input and output ports; and
an inductor, wherein the circuit is configured to selectively couple the inductor into the ground return path, whereby the impedance transformation changes depending upon whether the inductor is coupled into the ground return path, and wherein the transmission line transformer couples to the ground return path through a first node, and the inductor couples to the first node in parallel with a diode coupling to the first node such that the inductor is selectively coupled into the ground return path when the diode is non-conducting.

2. The circuit of claim 1, wherein the diode couples to the first node through a capacitor.

3. The circuit of claim 2, wherein the transmission line transformer is a 4:1 transformer.

4. The circuit of claim 2, wherein the transmission line transformer is a 9:1 transformer.

5. A circuit, comprising:
a transmission line transformer coupled between an input port and an output port, the transmission line transformer also being coupled to a ground return path, wherein the transmission line transformer provides an impedance transformation between the input and output ports; and
an inductor, wherein the circuit is configured to selectively couple the inductor into the ground return path, whereby the impedance transformation changes depending upon whether the inductor is coupled into the ground return path, wherein the inductor selectively couples into the ground return path through operation of a transistor switch, and wherein the transmission line transformer couples to the ground return path through a first node, and the inductor couples to the first node in parallel with the transistor switch such that the inductor is selectively coupled into the ground return path when the transistor switch is switched off.

6. The circuit of claim 5, wherein the transmission line transformer is a 4:1 transformer.

7. The circuit of claim 5, wherein the transmission line transformer is a 9:1 transformer.

8. A circuit, comprising:
a transmission line transformer coupled between an input port and an output port and configured to transmit energy from the input port to the output port by a transmission line mode, the transmission line transformer also being coupled to a ground return path, wherein the transmission line transformer provides an impedance transformation between the input and output ports;

an inductor, and means for selectively coupling the inductor into the ground return path, whereby the impedance transformation changes depending upon whether the inductor is coupled into the ground return path, and wherein the transmission line transformer couples to the ground return path through a first node, and the inductor couples to the first node in parallel with the means coupling to the first node such that the inductor is selectively coupled into the ground return path when the means is non-conducting.

9. The circuit of claim 8, wherein the means comprises a diode.

10. The circuit of claim 8, wherein the means comprises a transistor switch that is switched off.

11. A method of adjusting loading between an input and an output, comprising:
  (a) coupling a transmission line transformer between the input and the output to provide a first impedance transformation between the input and output, wherein the transmission line transformer is configured to transmit energy from the input port to the output port by a transmission line mode;
  (b) coupling an inductor into the ground return path of the transmission line transformer to provide a second impedance transformation between the input and output;
  (c) coupling the transmission line transformer to the ground return path through a first node;
  (d) coupling a diode to the first node; and
  (e) coupling the inductor to the first node in parallel with the diode such that the inductor is selectively coupled into the ground return path when the diode is non-conducting.

12. A method of adjusting loading between an input and an output, comprising:
  (a) coupling a transmission line transformer between the input and the output to provide a first impedance transformation between the input and output;
  (b) coupling an inductor into the ground return path of the transmission line transformer to provide a second impedance transformation between the input and output, wherein the transmission line transformer couples to the ground return path through a first node, and the inductor couples to the first node in parallel with a diode coupling to the first node such that the inductor is selectively coupled into the ground return path when the diode is non-conducting;
  (c) transmitting a modulated signal from a power source coupled to the input to a load coupled to the output, and
  (d) detecting a threshold change in either the power level of the modulated signal or the modulation mode of the modulated signal, wherein act (b) occurs only if act (d) detects a threshold change.

* * * * *